(12) United States Patent
Bolognia et al.

(10) Patent No.: US 8,102,032 B1
(45) Date of Patent: Jan. 24, 2012

(54) SYSTEM AND METHOD FOR COMPARTMENTAL SHIELDING OF STACKED PACKAGES

(75) Inventors: David Bolognia, Scottsdale, AZ (US); Mike Kelly, Queen Creek, AZ (US); Lee Smith, Chandler, AZ (US)

(73) Assignee: Amkor Technology, inc., Chandler, AZ (US)

( * ) Notice: Subject to any disclaimer, the term of this patent is extended or adjusted under 35 U.S.C. 154(b) by 544 days.

(21) Appl. No.: 12/330,769

(22) Filed: Dec. 9, 2008

(51) Int. Cl.
*H01L 21/56* (2006.01)

(52) U.S. Cl. ........ 257/659; 257/660; 257/686; 257/777; 257/E23.114; 257/E25.013; 257/E25.021; 257/E25.027; 361/799; 361/800; 361/816; 361/818

(58) Field of Classification Search .................. 257/659, 257/660, 686, 777, E23.114, E25.013, E25.018, 257/E25.021, E25.027; 361/799, 800, 816, 361/818
See application file for complete search history.

(56) References Cited

U.S. PATENT DOCUMENTS

| | | | |
|---|---|---|---|
| 4,925,024 A | 5/1990 | Ellenberger et al. | |
| 5,166,772 A | 11/1992 | Soldner et al. | |
| 5,416,358 A | 5/1995 | Ochi et al. | |
| 5,468,999 A | 11/1995 | Lin et al. | |
| 5,473,191 A | 12/1995 | Tanaka | |
| 5,557,142 A | 9/1996 | Gilmore et al. | |
| 5,614,694 A | 3/1997 | Gorenz, Jr. et al. | |
| 5,639,989 A | 6/1997 | Higgins, III | |
| 5,656,864 A | 8/1997 | Mitsue et al. | |
| 5,694,300 A | 12/1997 | Mattei et al. | |
| 5,907,477 A | 5/1999 | Tuttle et al. | |
| 5,940,271 A | 8/1999 | Mertol | |
| 6,136,131 A | 10/2000 | Sosnowski | |
| 6,194,655 B1 | 2/2001 | Lange, Sr. et al. | |
| 6,246,115 B1 | 6/2001 | Tang et al. | |
| 6,423,570 B1 | 7/2002 | Ma et al. | |
| 6,433,420 B1 | 8/2002 | Yang et al. | |
| 6,465,280 B1 | 10/2002 | Martin et al. | |
| 6,602,737 B2 | 8/2003 | Wu | |
| 6,686,649 B1 | 2/2004 | Mathews et al. | |
| 7,002,805 B2 | 2/2006 | Lee et al. | |
| 7,015,571 B2 | 3/2006 | Chang et al. | |
| 7,030,469 B2 | 4/2006 | Mahadevan et al. | |
| 7,129,571 B2 | 10/2006 | Kang | |
| 7,317,247 B2 | 1/2008 | Lee et al. | |
| 2002/0089832 A1 | 7/2002 | Huang | |
| 2003/0067757 A1 | 4/2003 | Richardson et al. | |
| 2004/0150102 A1* | 8/2004 | Lee et al. | 257/723 |
| 2005/0006745 A1* | 1/2005 | Nishimura | 257/686 |

(Continued)

*Primary Examiner* — Eugene Lee
*Assistant Examiner* — Peniel M Gumedzoe
(74) *Attorney, Agent, or Firm* — Weiss & Moy, P.C.; Jeffrey D. Moy

(57) ABSTRACT

A semiconductor device has a first substrate having a plurality of metal traces. At least one electronic component is electrically attached to a first surface of the first substrate. A second substrate has a plurality of metal traces and attached to the first substrate. At least one electronic component is electrically attached to a first surface of the second substrate. An RF shield is formed on the first substrate to minimizing Electro-Magnetic Interference (EMI) radiation and Radio Frequency (RF) radiation to the at least one electronic component on the first substrate to form an RF shield. A mold compound is used for encapsulating the semiconductor device.

20 Claims, 5 Drawing Sheets

U.S. PATENT DOCUMENTS

| | | |
|---|---|---|
| 2005/0280139 A1 | 12/2005 | Zhao et al. |
| 2006/0208347 A1* | 9/2006 | Kim .............................. 257/678 |
| 2007/0023203 A1* | 2/2007 | Leizerovich et al. ......... 174/255 |
| 2007/0030661 A1 | 2/2007 | Morris et al. |
| 2007/0141751 A1* | 6/2007 | Mistry et al. .................. 438/109 |
| 2008/0128881 A1* | 6/2008 | Sekiguchi ...................... 257/686 |
| 2008/0230887 A1* | 9/2008 | Sun et al. ....................... 257/686 |

* cited by examiner

SYSTEM AND METHOD FOR COMPARTMENTAL SHIELDING OF STACKED PACKAGES

FIELD OF THE INVENTION

This invention relates to Radio Frequency (RF) shielding and, more specifically, to a system and method for providing compartmental shielding in a semiconductor package that lessens the footprint of semiconductor packages which use a side by side solution.

BACKGROUND OF THE INVENTION

Radio Frequency (RF) shielding may be required on certain semiconductor devices and modules (hereinafter semiconductor device) in order to minimize Electro-Magnetic Interference (EMI) radiation from the semiconductor device. RF shielding is further required to prevent RF radiation from external sources from interfering with operation of the semiconductor device. In a semiconductor device which integrates multiple functions/modules (front end module+transmitter, radio+baseband, etc.) compartmental shielding may be required to minimize EMI radiation from the different components/modules and to prevent RF radiation from interfering with operation of the different components/modules in the semiconductor device.

Presently, there are several different methods used for compartmental shielding of semiconductor devices which integrates multiple functions/modules. Known methods of compartmental shielding include embedded shields, metal cans with compartmental features, wire fences, and laser ablated vias. All of the above approaches are designed for side by side solutions for compartmental shielding. Side by side solutions requires additional space and thus increases the footprint of the semiconductor package.

Therefore, a need existed to provide a system and method to overcome the above problem. The system and method would provide for compartmental RF shielding of a semiconductor device which lessens the footprint of prior art semiconductor devices which use a side by side solution.

SUMMARY OF THE INVENTION

A semiconductor device has a first substrate having a plurality of metal traces. At least one electronic component is electrically attached to a first surface of the first substrate. A second substrate has a plurality of metal traces and attached to the first substrate. At least one electronic component is electrically attached to a first surface of the second substrate. A first set of contacts is attached to ground planes on a second surface of the second substrate and to the first surface of the first substrate. The first set of contacts is placed around the at least one electronic component on the first substrate to form an RF shield. A mold compound is used for encapsulating the semiconductor device.

A semiconductor device has a first substrate having a plurality of metal layers, wherein at least one metal layer is exposed on at least one side surface of the first substrate. A first electronic component is coupled to a first surface of the first substrate. A second substrate has a plurality of metal layers and is attached to the first substrate, wherein at least one metal layer is exposed on at least one side surface of the second substrate. A second electronic component is coupled to a first surface of the second substrate. A plurality of interconnects is coupled to metal layers on a second surface of the first substrate and the first surface of the second substrate. A mold compound is used for encapsulating the semiconductor device. A conductive coating is applied to the mold compound and to the at least one metal layer exposed on at least one side surface of the first substrate and second substrate.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
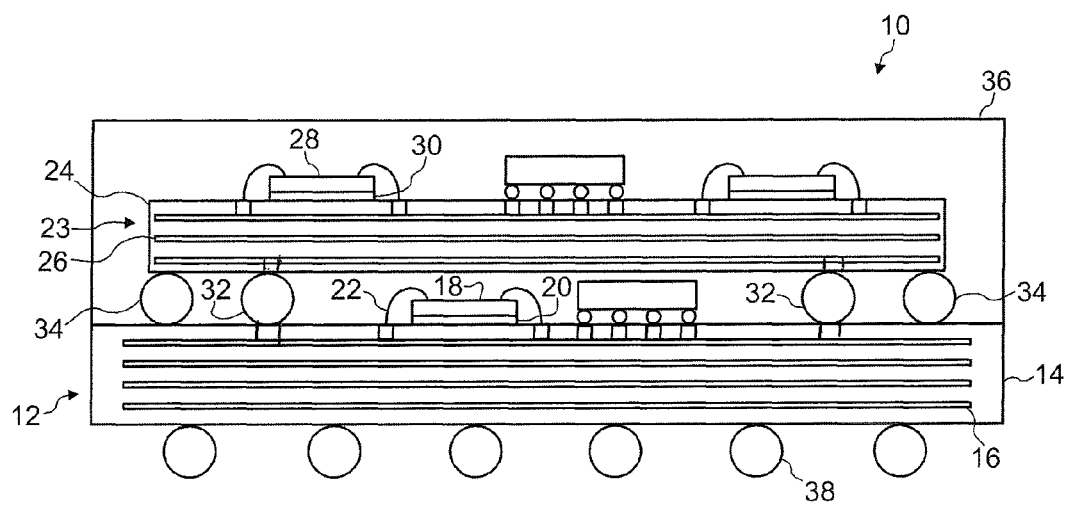
FIG. 1 is a cross-sectional side view of one embodiment of the semiconductor device of the present invention.
Figure 2A:
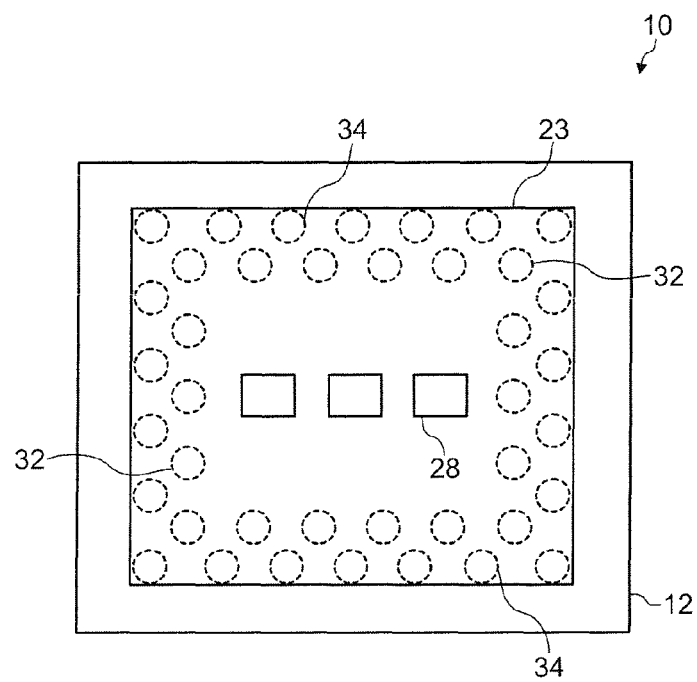
FIG. 2A is a top view of the semiconductor device depicted in FIG. 1.

Referring to FIGS. 1 and 2A, a semiconductor device 10 (hereinafter device 10) is shown. The device 10 provides compartmental shielding which lessens the footprint of prior art semiconductor devices which use a side by side solution.

The device 10 has a first substrate 12. The first substrate 12 may be any one chosen from a conventional rigid PCB, a flexible PCB, and an equivalent thereof, but the kind of first substrate 12 is not limited herein. The first substrate 12 includes an insulation layer 14 having predetermined area and thickness. The insulation layer 14 has an approximately planar first surface and an approximately planar second surface opposing the first surface. The first substrate 12 has a plurality of metal traces 16 formed on the first surface of the insulation layer 14. A plurality of metal traces 16 may also be formed on the second surface of the insulation layer 14. The number of metal traces 16 is not limited to the number shown in the Figures. If multiple layers of metal traces 16 are formed, a dielectric layer may be applied between the metal traces 16. The dielectric layer is used as an insulating layer to separate two signal layers. A soldermask may be placed over the top surface of the metal traces 16 formed on the first substrate 12. The soldeiinask is used to protect the metal traces 16.

One or more electronic component 18 is attached to a first surface of the first substrate 12. The electronic component 18 may be prepackaged semiconductor device, bare semiconductor die, or a passive component. The prepackaged semiconductor device may be a RF device, memory device, a logic device, an ASIC device, and other like elements. The prepackaged semiconductor device may also be a multi-chip module. It should be noted that the listing of the above types of prepackaged semiconductor devices is given as an example and should not be seen as to limit the scope of the present invention. The bare semiconductor die may be a RF device, memory die, a logic die, an ASIC die, and other like elements. It should be noted that the listing of the above types of bare semiconductor dies is given as an example and should not be seen as to limit the scope of the present invention. The passive component may be any type of passive electronic component. The passive component may be packaged singly such as a resistor, capacitor, transistor, diode, and the like or as an array of passive circuits. The listing of the above is given as an example and should not be seen as to limit the scope of the present invention.

The electronic component 18 is coupled to a first surface of the first substrate 12. The electronic component 18 may be coupled to the first surface of the first substrate 12 in a plurality of different manners. In the embodiment shown in FIGS. 1 and 2, the electronic components 18 include bare semiconductor die. An adhesive 20 may be used to couple the die to the first substrate 12. The adhesive 20 may be an adhesive film, an epoxy, or the like. The listing of the above adhesive types should not be seen as to limit the scope of the present invention. The die is then electrically coupled to the first substrate 12 through the use of wirebonds 22. Alternatively, the die may be coupled to the substrate 12 through flip chip bonding, surface mount technology (SMT) or the like.

The device 10 has a second substrate 23. The second substrate 23 may be any one chosen from a conventional rigid PCB, a flexible PCB, and an equivalent thereof, but the kind of substrate 23 is not limited herein. For example, the second substrate 23 may be a lead frame type structure. The second substrate 23 includes an insulation layer 24 having predetermined area and thickness. The insulation layer 24 has an approximately planar first surface and an approximately planar second surface opposing the first surface. The second substrate 23 has a plurality of metal traces 26 formed on the first surface of the insulation layer 24 and a plurality of metal traces 26 formed on the second surface thereof. The number of metal traces 26 is not limited to the number shown in the Figures. If multiple layers of metal traces 26 are formed, a dielectric layer is generally applied between the metal traces 26. The dielectric layer is used as an insulating layer to separate two signal layers. A soldermask is generally placed over the top surface of the metal traces 26 formed on the second substrate 23. The soldermask is used to protect the metal traces 26. In the embodiment shown in FIGS. 1 and 2, the width of the second substrate 23 is less than the width of the first substrate 12.

One or more electronic component 28 is coupled to a first surface of the second substrate 23. The electronic component 28 may be prepackaged semiconductor device, bare semiconductor die, or a passive component. The prepackaged semiconductor device may be a RF device, memory device, a logic device, an ASIC device, and other like elements. The prepackaged semiconductor device may also be a multi-chip module. It should be noted that the listing of the above types of prepackaged semiconductor devices is given as an example and should not be seen as to limit the scope of the present invention. The bare semiconductor die may be a RF device, memory die, a logic die, an ASIC die, and other like elements. It should be noted that the listing of the above types of bare semiconductor dies is given as an example and should not be seen as to limit the scope of the present invention. The passive component may be any type of passive electronic component. The passive component may be packaged singly such as a resistor, capacitor, transistor, diode, and the like or as an array of passive circuits. The listing of the above is given as an example and should not be seen as to limit the scope of the present invention.

The electronic component 28 may be coupled to the first surface of the second substrate 23 in a plurality of different manners. The electronic component 28 may be attached to the first surface of the second substrate 23 with an adhesive 30 and wirebonded. Alternatively, the electronic component 28 may be coupled to the second substrate 23 through flip chip bonding, surface mount technology (SMT) or the like.

The second substrate 23 is coupled to the first surface of the first substrate 12 so as to be elevated above the first surface of the first substrate 12. A first set of contacts 32 are used to attach a second surface of the second substrate 23 to the first surface of the first substrate 12. The first set of contacts 32 are positioned around a first perimeter of the second surface of the second substrate 23 and attach to metal traces 26 of the second substrate 23 which acts as a ground plane. The first set of contacts 32 are also attached to metal traces 16 on the first surface of the first substrate 12 which acts as a ground plane. Thus, the first set of contacts 32 is grounded creating an RF shield around the electronic components 18 on the first surface of the first substrate 12. The first set of contacts 32 may be a plurality of solder balls as shown in FIGS. 1 and 2A.

Figure 2B:
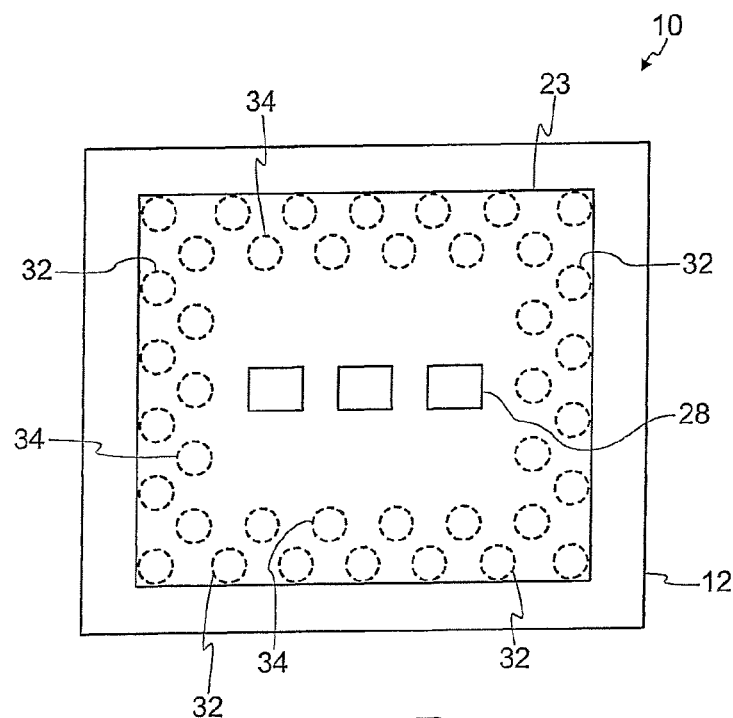
FIG. 2B is a top view of the semiconductor device depicted in FIG. 1 with the position of the first and second set of contacts switched.
Figure 2C:
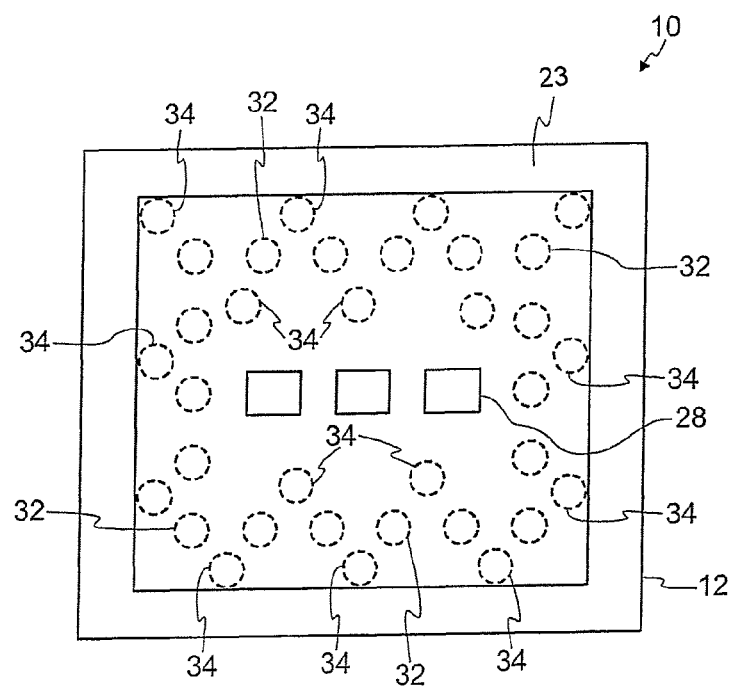
FIG. 2C is a top view of the semiconductor device depicted in FIG. 1 with the position of the first and second set of contacts staggered.

A second set of contacts 34 may be placed around a second perimeter of the second substrate 23. The second set of contacts 34 can be used to provide an electrical connection between metal traces 16 on the first substrate 12 and metal traces 26 on the second substrate 23. The second set of contacts 34 may be a plurality of solder balls as shown in FIGS. 1 and 2A. As shown in FIG. 2A, the first set of contacts 32 may be placed inside of the second set of contacts 34. In an alternative embodiment as shown in FIG. 2B, the contacts 32 may be placed around an outer perimeter of the second substrate 12 and contacts 34 may be placed inside the perimeter formed by the contacts 32. In still another embodiment as shown in FIG. 2C, the contacts 32 and 34 may be placed in a staggered pattern wherein the contacts 34 are placed in front of and behind the contacts 32.

A mold compound 36 is used to encapsulate the device 10. The mold compound 36 is mainly made of thermosetting plastic material like epoxy. The mold compound 36 is used to encapsulate the components of the device 10 (i.e., electronic components 18 and 28), the second substrate 23, and the first and side surfaces of the first substrate 12.

A third set of contacts 38 may be coupled to the second surface of the first substrate 12. In the embodiment shown in FIGS. 1 and 2, the third set of contacts 38 are solder balls 38. If solder balls 38 are used, the solder balls 38 will be electrically coupled to the second surface of the first substrate 12. In general, a reflow process may be used to couple the solder balls 38 to the second surface of the first substrate 12. Alternative methods may be used to couple different types of contacts to the first substrate 12 without departing from the spirit and scope of the present invention.

Figure 3:
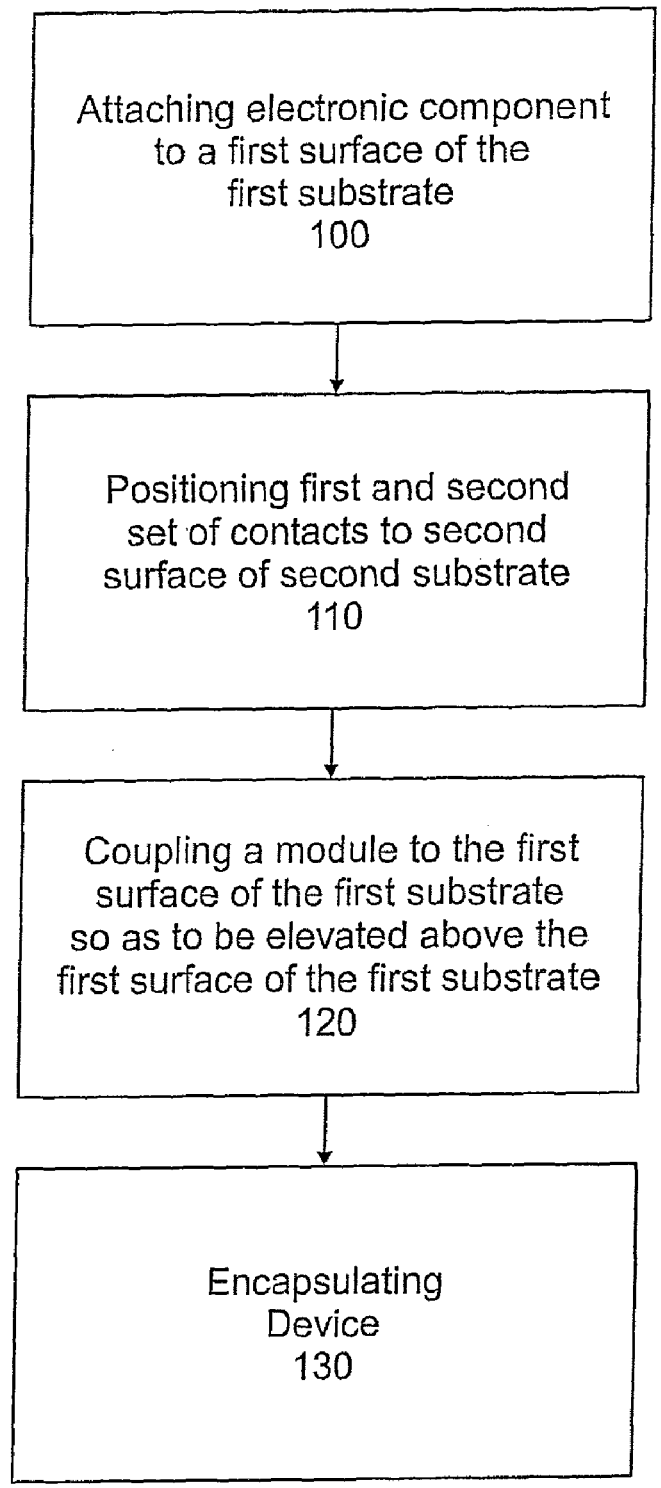
FIG. 3 is a flow chart describing a method of forming the semiconductor device depicted in FIG. 1.

Referring to FIGS. 1-3, a method of forming the device 10 is shown. The device 10 is generally assembled in strip fashion. Thus, a plurality of devices 10 are formed from a single substrate strip. As shown in Step 100, one or more electronic component 18 are attached to a first surface of the first substrate 12. The electronic component 18 may be coupled to the first surface of the first substrate 12 in a plurality of different manners. In accordance with one embodiment, an adhesive 20 may be used to couple the bare die electronic component 18 to the first substrate 12. The adhesive 20 may be an adhesive film, an epoxy, or the like. The listing of the above adhesive types should not be seen as to limit the scope of the present invention. The electronic component 18 is then electrically coupled to the first substrate 12 through the use of wirebonds 22. Alternatively, the electronic component 18 may be coupled to the substrate 12 through flip chip bonding, surface mount technology (SMT) or the like. Step 100 may also performed for components 28 coupled to substrate 23 in a separate strip form assembly flow followed by a singulation process to remove a unit assembly from the multiple unit strip.

Next as shown in Step 110, a first set of contacts 32 are positioned around a first perimeter of a second surface of a second substrate 23 and attach to metal traces 26 of the second substrate 23 which acts as a ground plane. A second set of contacts 34 may be placed around a second perimeter of the second substrate 23 and attached to metal traces 26.

A module is coupled to the first surface of the first substrate 12 so as to be elevated above the first surface of the first substrate 12 as shown in Step 120. The module comprises the second substrate 23 having one or more electronic component 28 coupled to a first surface of the second substrate 23. The electronic component 28 may be coupled to the first surface of the second substrate 23 in a plurality of different manners. The electronic component 28 may be attached to the first surface of the second substrate 23 with an adhesive 30 and wirebonded. Alternatively, the electronic component 28 may be coupled to the second substrate 23 through flip chip bonding, surface mount technology (SMT) or the like.

The module is attached so that the first set of contacts 32 are attached to metal traces 16 on the first surface of the first substrate 12 which acts as a ground plane. Thus, the first set of contacts 32 is grounded creating an RF shield around the electronic components 18 on the first surface of the first substrate 12. The first set of contacts 32 may be a plurality of solder balls as shown in FIGS. 1-2C. The second set of contacts 34 which are attached to metal traces 16 on the first surface of the first substrate can be used to provide an electrical connection between the first substrate 12 and the second substrate 23. The second set of contacts 34 may also be a plurality of solder balls as shown in FIGS. 1-2C. The first set of contacts 32 may be placed inside of the second set of contacts 34 as shown in FIG. 2A. In an alternative embodiment as shown in FIG. 2B, the contacts 32 may be placed around an outer perimeter of the second substrate 12 and contacts 34 may be placed inside the perimeter formed by the contacts 32. In still another embodiment as shown in FIG. 2C, the contacts 32 and 34 may be placed in a staggered pattern wherein the contacts 34 are placed in front of and behind the contacts 32.

A mold compound 36 is used to encapsulate the device 10 as shown in Step 130. The mold compound 36 is mainly made of thermosetting plastic material like epoxy. The mold compound 36 is used to encapsulate the components of the device 10 (i.e., electronic components 18 and 28), the second substrate 23, and the first and side surfaces of the first substrate 12.

A third set of contacts 38 may be coupled to the second surface of the first substrate. In the embodiment shown in FIGS. 1-2C, the third set of contacts 38 are solder balls 38. If solder balls 38 are used, the solder balls 38 will be electrically coupled to the second surface of the first substrate 12. In general, a reflow process may be used to couple the solder balls 38 to the second surface of the first substrate 12. Alternative methods may be used to couple different types of contacts to the first substrate 12 without departing from the spirit and scope of the present invention Referring to FIGS. 4-6, another embodiment of the device 10' is shown. The device 10' provides compartmental shielding which lessens the footprint of prior art semiconductor devices which use a side by side solution.

Like the previous embodiment, the device 10' has a first substrate 12. The first substrate 12 includes an insulation layer 14 having predetermined area and thickness. The first substrate 12 has a plurality of metal traces 16 formed on the first surface of the insulation layer 14. A plurality of metal traces 16 may also be formed on the second surface of the insulation layer 14. The number of metal traces 16 is not limited to the number shown in the Figures. If multiple layers of metal traces 16 are formed, a dielectric layer may be applied between the metal traces 16. The dielectric layer is used as an insulating layer to separate two signal layers. A soldermask may be placed over the top surface of the metal traces 16 formed on the first substrate 12. The soldermask is used to protect the metal traces 16.

One or more electronic component 18 is attached to the first surface of the first substrate 12. The electronic component 18 may be any type of active or passive device. The electronic component 18 may be coupled to the first surface of the first substrate 12 in a plurality of different manners. In accordance with one embodiment, an adhesive 20 may be used to couple the electronic component 18 to the first substrate 12. The adhesive 20 may be an adhesive film, an epoxy, or the like. The electronic component 18 is then electrically coupled to the first substrate 12 through the use of wirebonds 22. Alternatively, the electronic component 18 may be coupled to the substrate 12 through flip chip bonding, surface mount technology (SMT) or the like.

The device 10' has a second substrate 23. The second substrate 23 includes an insulation layer 24 having predetermined area and thickness. The second substrate 23 has a plurality of metal traces 26 formed on the first surface of the insulation layer 24 and a plurality of metal traces 26 formed on the second surface thereof. If multiple layers of metal traces 26 are formed, a dielectric layer may be applied between the metal traces 26. The dielectric layer is used an insulating layer to separate two signal layers. A soldermask may be placed over the top surface of the metal traces 26 formed on the second substrate 23. The soldermask is used to protect the metal traces 26. In the embodiment shown in FIGS. 4-6, the width of the second substrate 23 is approximately the same as the width of the first substrate 12.

One or more electronic component 28 is coupled to the first surface of the second substrate 23. The electronic component 28 may be any type of active or passive device. The component 28 may be coupled to the first surface of the second substrate 23 in a plurality of different manners. If a bare die active or passive device 28, it may be attached to the first surface of the second substrate 23 with an adhesive 30 and wirebonded. Alternatively, the component 28 may be coupled to the second substrate 23 through flip chip bonding, surface mount technology (SMT) or the like.

The second substrate 23 is coupled to the first surface of the first substrate 12 so as to be elevated above the first surface of the first substrate 12. Contacts 33 are used to attach the second surface of the second substrate 23 to the first surface of the first substrate 12. The contacts 33 are positioned around a perimeter or in an array fashion on the second surface of the second substrate 23 and attach to metal traces 26 of the second substrate 23. Contacts 33 are also attached to metal traces 16 on the first surface of the first substrate 12. Contacts 33 may be used to transfer electrical signals between the first substrate 12 and the second substrate 23, or act as power/ground supplies.

A mold compound 36 is used to encapsulate the device 10'. The mold compound 26 is mainly made of thermosetting plastic material like epoxy. The mold compound 36 is used to encapsulate the electronic components 18 and 28 of the device 10', the second substrate 23, and the first surface and side surfaces of the first substrate 12.

To provide compartmental shielding for the device 10', at least one metal trace 16 may be exposed on a side surface of the first substrate 12. At least one metal trace 26 may also be exposed on a side surface of the second substrate 23. The exposed metal trace 16 and/or 26 will be used as ground planes.

The side surface of the first substrate 12 is generally a surface adjacent to the first surface of the first substrate 12. In the embodiment shown in FIGS. 4-6, the side surface is the surface adjacent and approximately perpendicular to the first surface of the first substrate 12. In a similar manner, the side surface of the second substrate 23 is generally a surface adjacent to the first surface of the second substrate 23. In the embodiment shown in FIGS. 4-6, the side surface is the surface adjacent and approximately perpendicular to the first surface of the second substrate 12. All four sides of the device 10' may be formed so that one of the metal 16 and/or 26 is exposed on each side of the device 10'.

A conductive coating 42 is then applied to the device 10'. The conductive coating 42 is used to provide RF shielding for the device 10'. The conductive coating 42 may be applied by plating, vacuum printing, vacuum deposition, insert molding, spray coating, and the like. The conductive coating 42 is applied to the top surface of the device 10' and to the side surfaces of the device 10'. The conductive coating 42 is applied so that the conductive coating 42 will be in contact with the exposed metal traces 16 and/or 26. Thus, the device 10' will have a conductive coating 42 that contacts grounded metal (i.e., the exposed metal traces 16 and/or 26). The conductive coating 42 in contact with the exposed metal trace 16 creates a compartmental RF shield around the electronic component 18 on the first surface of the first substrate 12. In a similar manner, the conductive coating 42 in contact with the exposed metal trace 26 creates a compartmental RF shield around the electronic component 28 on the first surface of the second substrate 23.

Figure 4:
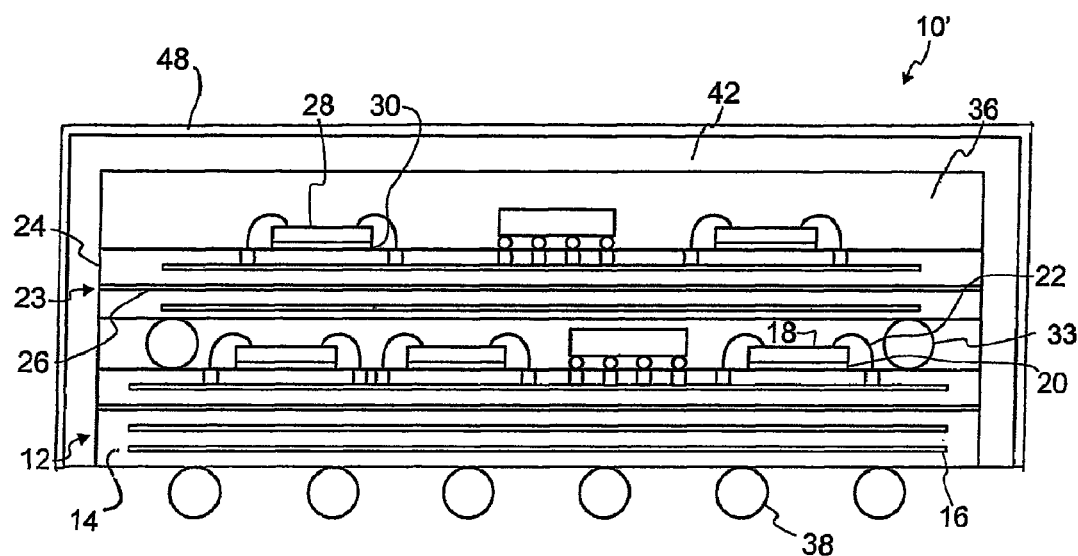
FIG. 4 is a cross-sectional side view of another embodiment of the semiconductor device of the present invention.
Figure 5:
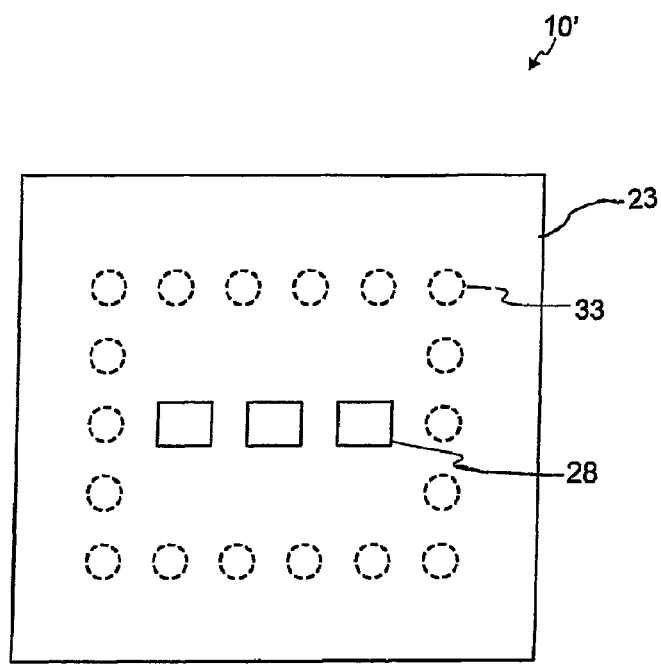
FIG. 5 is a top view of the semiconductor device depicted in FIG. 4.
Figure 6:
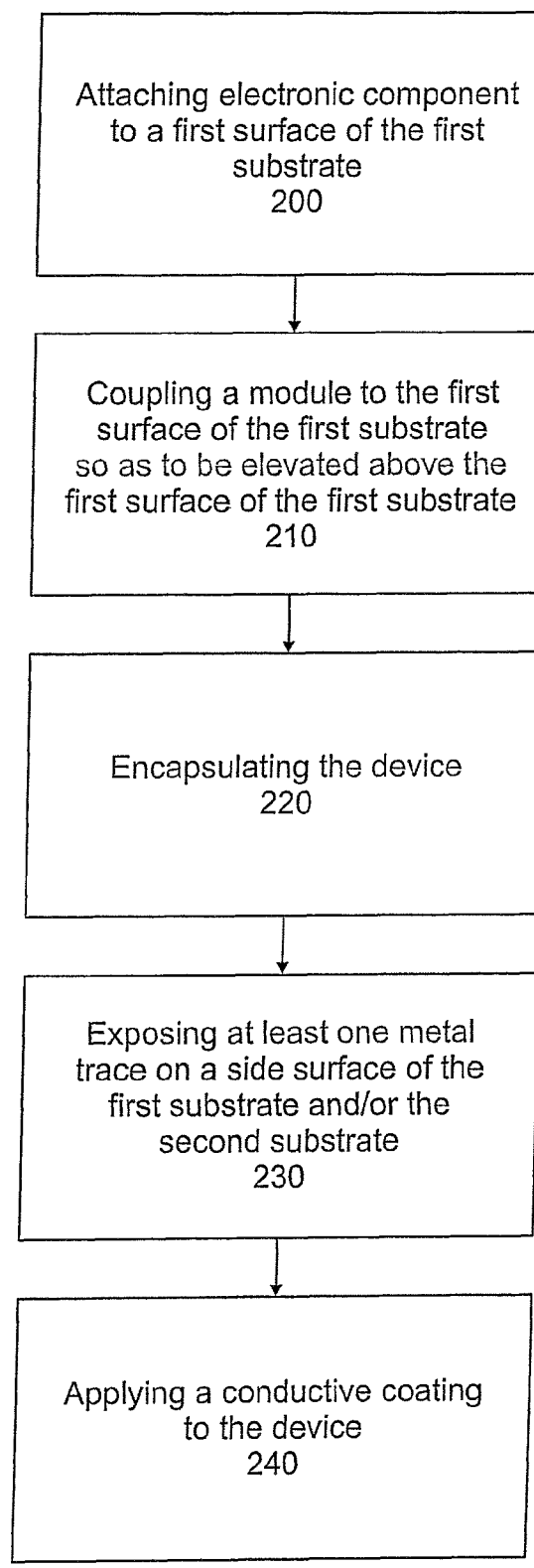
FIG. 6 is a flow chart describing a method of forming the semiconductor device depicted in FIG. 4.

In FIGS. 4-6, the conductive coating 42 is a conformal coating. In a conformal coating, a thin layer of the conductive coating 42 is applied to the top surface of the device 10' and to the side surface of the device 10'. The conductive coating 42 is applied to the side surface of the device 10' so that the side surface will have a thin layer of conductive coating 42 similar in thickness to the conductive coating applied to the top surface of the device 10'.

A non-conductive coating 48 may be applied to the conductive coating 42. The non-conductive coating 48 is used as a protective layer to protect the conductive coating 42 and hence the device 10' from solvents, solders, fluxes, etc. The non-conductive coating 48 may be applied to the stacked device 10' or to a single package device having a conductive coating 42. Although FIG. 4 shows the non-conductive coating 48, the non-conductive coating 48 is an optional element.

Electrical contacts 38 may be coupled to the second surface of the first substrate 12. In the embodiment shown in FIGS. 4 and 5, the electrical contacts 38 are solder balls 38. If solder balls 38 are used, the solder balls 38 will be electrically coupled to the second surface of the first substrate 12. In general, a reflow process may be used to couple the solder balls 38 to the second surface of the first substrate 12. Alternative methods may be used to couple different types of contacts to the first substrate 12 without departing from the spirit and scope of the present invention.

Referring now to FIGS. 4-6, a method of foaming the semiconductor device 10' will be described. The semiconductor device 10' is assembled in strip fashion as shown. Thus, a plurality of semiconductor devices 10' are formed from a single substrate strip. The substrate strip is segmented into a plurality of rows and columns to form individual semiconductor devices 10'.

As shown in Step 200, one or more electronic component 18 is attached to a first surface of the first substrate 12. The electronic component 18 may be coupled to the first surface of the first substrate 12 in a plurality of different manners. In accordance with one embodiment, an adhesive 20 may be used to couple the electronic component 18 to the first substrate 12. The adhesive 20 may be an adhesive film, an epoxy, or the like. The electronic component 18 is then electrically coupled to the first substrate 12 through the use of wirebonds 22. Alternatively, the electronic component 18 may be coupled to the substrate 12 through flip chip bonding, surface mount technology (SMT) or the like. Step 200 may also performed for components 28 coupled to substrate 23 in a separate strip form assembly flow possibly followed by a singulation process to remove a unit or a sub group of assembled units from the multiple unit strip.

A module is then coupled to the first surface of the first substrate 12 so as to be elevated above the first surface of the first substrate 12 as shown in Step 210. The module comprises a second substrate 23. One or more electronic component 28 is coupled to the first surface of the second substrate 23. The electronic component 28 may be coupled to the first surface of the second substrate 23 in a plurality of different manners. The electronic component 28 may be attached to the first surface of the second substrate 23 with an adhesive 30 and wirebonded. Alternatively, the electronic component 28 may be coupled to the second substrate 23 through flip chip bonding, surface mount technology (SMT) or the like.

The second substrate 23 is coupled to the first surface of the first substrate 12 so as to be elevated above the first surface of the first substrate 12. Connectors 33 are used to attach the second surface of the second substrate 23 to the first surface of the first substrate 12. Connectors 33 are positioned around a perimeter of the second surface of the second substrate 23 and attach to metal traces 26 of the second substrate. Connectors 33 are also attached to metal traces 16 on the first surface of the first substrate 12. Connectors 33 may be used to transfer electrical signals between the first substrate 12 and the second substrate 23, or act as power/ground nodes.

Next as shown in Step 220, a mold compound 36 is used to encapsulate the device 10'. The mold compound 36 is mainly made of thermosetting plastic material like epoxy. The mold compound 36 is used to encapsulate the electronic components 18 and 28 of the device 10', the second substrate 23, and the first surface and side surfaces of the first substrate 12.

To provide compartmental shielding for the device 10', at least one metal trace 16 may be exposed on a side surface of the first substrate 12 as shown in Step 230. At least one metal trace 26 may also be exposed on a side surface of the second substrate 23. The exposed metal trace 16 and/or 26 will be used as ground planes. The metal trace 16 and/or 26 may be exposed by performing a saw cut to singulate the substrate strip to form the individual semiconductor devices 10'. Other methods may be used to expose the metal trace 16 and/or 26 without departing from the spirit and scope of the present invention.

A conductive coating 42 is then applied to the device 10' as shown in Step 240. The conductive coating 42 is used to provide RF shielding for the device 10'. The conductive coating 42 may be applied by plating, vacuum printing, vacuum deposition, insert molding, spray coating, and the like. The conductive coating 42 is applied to the top surface of the device 10' and to the side surfaces of the device 10'. The conductive coating 42 is applied so that the conductive coating 42 will be in contact with the exposed metal traces 16 and/or 26. Thus, the device 10' will have a conductive coating 42 that contacts grounded metal (i.e., the exposed metal traces 16 and/or 26). The conductive coating 42 in contact with the exposed metal trace 16 creates a compartmental RF shield around the electronic components 18 on the first surface of the first substrate 12. In a similar manner, the conductive coating 42 in contact with the exposed metal trace 26 creates a compartmental RF shield around the electronic components 28 on the first surface of the second substrate 23.

A non-conductive coating 48 may be applied to the conductive coating 42. The non-conductive coating 48 is used as a protective layer to protect the conductive coating 42 and hence the device 10' from solvents, solders, fluxes, etc. The non-conductive coating 48 may be applied to the stacked device 10' or to a single package device having a conductive coating 42.

Electrical contacts 38 may be coupled to the second surface of the first substrate 12. In the embodiment shown in FIGS. 4 and 5, the electrical contacts 38 are solder balls 38. If solder balls 38 are used, the solder balls 38 will be electrically coupled to the second surface of the first substrate 12. In general, a reflow process may be used to couple the solder balls 38 to the second surface of the first substrate 12. Alternative methods may be used to couple different types of contacts to the first substrate 12 without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor device comprising:
   a first substrate having a plurality of metal traces;
   at least one electronic component electrically attached to a first surface of the first substrate;
   a second substrate having a plurality of metal traces and attached to the first substrate;
   at least one electronic component electrically attached to a first surface of the second substrate;
   a first set of contacts attached to ground planes on a second surface of the second substrate and to the first surface of the first substrate, the first set of contacts placed around the at least one electronic component on the first substrate to form an RF shield; and
   a single layer of a mold compound for encapsulating exposed areas of the second substrate, exposed areas the at least one electronic component electrically attached to the first surface of the second substrate, and exposed areas of the first set of contacts.

2. A semiconductor device in accordance with claim 1 further comprising a second set of contacts attached to the second surface of the second substrate and to the first surface of the first substrate to electrically couple the first substrate to the second substrate.

3. A semiconductor device in accordance with claim 1 further comprising a third set of contacts attached to the second surface of the first substrate.

4. A semiconductor device in accordance with claim 1 wherein the first set of contacts are placed around an outer perimeter of the second surface of the second substrate.

5. A semiconductor device in accordance with claim 1 wherein a width of the second substrate is less then a width of the first substrate.

6. A semiconductor device in accordance with claim 1 wherein a first set of contacts is solder balls.

7. A semiconductor device comprising:
   a first substrate having a plurality of metal layers, wherein at least one metal layer is exposed on at least one side surface of the first substrate;
   a first electronic component coupled to a first surface of the first substrate;
   a second substrate having a plurality of metal layers and attached to the first substrate, wherein at least one metal layer is exposed on at least one side surface of the second substrate;
   a second electronic component coupled to a first surface of the second substrate;
   a first plurality of contacts coupled to metal traces on a second surface of the first substrate and the first surface of the second substrate;
   a mold compound encapsulating the semiconductor device; and
   a conductive coating applied to the mold compound and to the at least one metal layer exposed on at least one side surface of the first substrate and second substrate.

8. A semiconductor device in accordance with claim 7 wherein the conductive coating is a conformal coating.

9. A semiconductor device in accordance with claim 7 wherein the conductive coating is an over mold coating.

10. A semiconductor device in accordance with claim 7 further comprising a second plurality of contacts coupled to a second surface of the second substrate.

11. A semiconductor device in accordance with claim 7 wherein the at least one side surface of the first substrate is adjacent to the first surface of the first substrate.

12. A semiconductor device in accordance with claim 7 wherein the at least one side surface of the second substrate is adjacent to the first surface of the second substrate.

13. A semiconductor device comprising:
   a first substrate having a plurality of metal traces;
   at least one electronic component electrically attached to a first surface of the first substrate;
   a second substrate having a plurality of metal traces and attached to the first substrate;
   at least one electronic component electrically attached to a first surface of the second substrate;
   means coupled to the first substrate for forming an RF shield around the at least one electronic component electrically attached to the first substrate; and
   a single layer of a mold compound for encapsulating exposed areas of the second substrate, exposed areas of the at least one electronic component electrically attached to the first surface of the second substrate, and exposed areas of the means for forming the RF shield.

14. A semiconductor device in accordance with claim 13 further comprising means coupled to the second substrate for forming an RF shield around the at least one electronic component electrically attached to the second substrate.

15. A semiconductor device in accordance with claim 13 wherein the means coupled to the first substrate for forming an RF shield comprises a first set of contacts attached to ground planes on a second surface of the second substrate and to the first surface of the first substrate, the first set of contacts placed around the at least one electronic component on the first substrate.

16. A semiconductor device in accordance with claim 15 further comprising a second set of contacts formed on an outer perimeter of the first set of contacts to electrically couple the first substrate to the second substrate.

17. A semiconductor device in accordance with claim 15 wherein the first set of contacts are placed around an outer perimeter of the second surface of the second substrate.

18. A semiconductor device in accordance with claim 15 wherein a plurality of interconnects coupled to metal traces on a second surface of the first substrate and the first surface of the second substrate to electrically attach the first substrate to the second substrate.

19. A semiconductor device in accordance with claim 13 wherein the means coupled to the first substrate for forming an RF shield comprises a conductive coating applied to the mold compound and to at least one metal layer exposed on at least one side surface of the first substrate.

20. A semiconductor device in accordance with claim 14 wherein the means coupled to the second substrate for forming an RF shield comprises a conductive coating applied to the mold compound and to at least one metal layer exposed on at least one side surface of the second substrate.

\* \* \* \* \*